(12) United States Patent
Simin et al.

(10) Patent No.: US 9,991,372 B2
(45) Date of Patent: Jun. 5, 2018

(54) DEVICE WITH CHANNEL HAVING VARYING CARRIER CONCENTRATION

(71) Applicant: Sensor Electronic Technology, Inc., Columbia, SC (US)

(72) Inventors: Grigory Simin, Columbia, SC (US); Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days. days.

(21) Appl. No.: 15/263,701

(22) Filed: Sep. 13, 2016

(65) Prior Publication Data

US 2017/0077278 A1 Mar. 16, 2017

Related U.S. Application Data

(60) Provisional application No. 62/218,035, filed on Sep. 14, 2015.

(51) Int. Cl.
| | |
|---|---|
| *H01L 29/00* | (2006.01) |
| *H01L 29/778* | (2006.01) |
| *H01L 29/06* | (2006.01) |
| *H01L 29/10* | (2006.01) |
| *H01L 29/201* | (2006.01) |
| *H01L 29/20* | (2006.01) |
| *H01L 29/417* | (2006.01) |
| *H01L 29/423* | (2006.01) |

(52) U.S. Cl.
CPC ...... *H01L 29/7786* (2013.01); *H01L 29/0657* (2013.01); *H01L 29/1037* (2013.01); *H01L 29/1045* (2013.01); *H01L 29/201* (2013.01); *H01L 29/2003* (2013.01); *H01L 29/41758* (2013.01); *H01L 29/42316* (2013.01)

(58) Field of Classification Search
CPC .................................................. H01L 29/7786
See application file for complete search history.

(56) References Cited

U.S. PATENT DOCUMENTS

| | | | |
|---|---|---|---|
| 2014/0091373 A1 | 4/2014 | Simin et al. | |
| 2014/0291740 A1 | 10/2014 | Simin et al. | |
| 2015/0060875 A1* | 3/2015 | Kume | H01L 29/7835 257/76 |
| 2015/0102388 A1 | 4/2015 | Simin et al. | |

OTHER PUBLICATIONS

Feiler, et al., "Multistep field plates for high-voltage planar p-n junctions," IEEE Trans. Electron Devices, Jun. 1992, 7 pages, vol. 39, No. 6.
Karmalkar, et al., "Enhancement of breakdown voltage in AlGaN/GaN high electron mobility transistors using a field plate," Electron Devices, IEEE Transactions, 2001, 7 pages, vol. 48, No. 8.
Saito, et al., "Theoretical limit estimation of lateral wide band-gap semiconductor power-switching device," Solid-State Electronics, Sep. 2004, 8 pages, vol. 48, No. 9.

* cited by examiner

*Primary Examiner* — William Harriston
(74) *Attorney, Agent, or Firm* — LaBatt, LLC

(57) ABSTRACT

A semiconductor device including a device channel with a gate-drain region having a carrier concentration that varies laterally along a direction from the gate contact to the drain contact is provided. Lateral variation of the carrier concentration can be implemented by laterally varying one or more attributes of one or more layers located in the gate-drain region of the device.

20 Claims, 9 Drawing Sheets

DEVICE WITH CHANNEL HAVING VARYING CARRIER CONCENTRATION

REFERENCE TO RELATED APPLICATIONS

The current application claims the benefit of U.S. Provisional Application No. 62/218,035, which was filed on 14 Sep. 2015, and which is hereby incorporated by reference.

TECHNICAL FIELD

The disclosure relates generally to field-effect transistors, and more particularly, to a field-effect transistor with a significantly improved breakdown voltage.

BACKGROUND ART

High power field-effect transistors (FETs), such as gallium nitride (GaN) based heterostructure field effect transistors (HFETs), feature increasingly high powers and breakdown voltages. Although these features make such devices extremely promising for various applications in power electronics, certain material and device specifics significantly limit their performance characteristics. On an important limitation of GaN-based HFETs, as well as other FETs operating at high voltage, is a non-uniform electric field profile present in the gate-drain spacing. FIG. 1 shows a conventional heterostructure FET (HFET) 2 according to the prior art, and FIG. 2 shows an illustrative electric field distribution chart according to the prior art. As illustrated in FIG. 2, the electric field profile in the gate-drain spacing having a distance, $L_{GD}$, shown in FIG. 1 exhibits a strong peak near the gate edge when the HFET 2 is operated as a switch (without field plate). The peak width is defined by the carrier concentration in the channel. To this extent, a breakdown voltage for the HFET 2 does not increase when the gate-drain spacing distance $L_{GD}$ is increased.

One approach to lower the peak electric field near the gate edge is the use of one or more field-modulating plates (FPs), which can be connected to either the gate, source, or drain electrode. FIG. 2 illustrates an illustrative field plate connected to a gate and the resulting electric field distribution. A multistep field plate structure is shown in FIG. 3, and a gradual field plate structure is shown in FIG. 4. In each case, the field plate structure decreases the peak field near the gate electrode edge by splitting it into two or more peaks, thereby increasing the breakdown voltage for the device. However, even multiple field plate structures cannot achieve a uniform electric field in the device channel. Additionally, these approaches can degrade performance due to excessive capacitances associated with the field-plate electrodes.

SUMMARY OF THE INVENTION

Aspects of the invention provide a semiconductor device including a device channel with a gate-drain region having a carrier concentration that varies laterally along a direction from the gate contact to the drain contact. Lateral variation of the carrier concentration can be implemented by laterally varying one or more attributes of one or more layers located in the gate-drain region of the device.

A first aspect of the invention provides a semiconductor device comprising: a semiconductor heterostructure forming a device channel; a gate contact located on the semiconductor heterostructure; and a drain contact located on the semiconductor heterostructure, wherein the device channel includes a gate-drain region located between the gate contact and the drain contact, and wherein the gate-drain region of the device channel has a carrier concentration that varies laterally along a direction from the gate contact to the drain contact.

A second aspect of the invention provides a method of fabricating a semiconductor device, the method comprising: fabricating a semiconductor heterostructure forming a device channel; fabricating a gate contact on the semiconductor heterostructure; and fabricating a drain contact on the semiconductor heterostructure, wherein the device channel includes a gate-drain region located between the gate contact and the drain contact, wherein the gate-drain region of the device channel has a carrier concentration that varies laterally along a direction from the gate contact to the drain contact, and wherein the laterally varying carrier concentration increases uniformity of an electric filed distribution in a gate-drain region of the semiconductor device.

A third aspect of the invention provides a method of fabricating a semiconductor device, the method comprising: creating a semiconductor heterostructure design including: a channel layer; a barrier layer located immediately adjacent to the channel layer; and a device channel formed at an interface of the channel layer and the barrier layer, wherein the creating includes altering at least one attribute of the semiconductor heterostructure design such that the device channel has a carrier concentration that varies laterally along a direction from a location for a gate contact to a location for a drain contact to increase uniformity of an electric filed distribution in a gate-drain region of the semiconductor device; fabricating the semiconductor heterostructure according to the semiconductor heterostructure design; fabricating a gate contact on the semiconductor heterostructure at the location for the gate contact; and fabricating a drain contact on the semiconductor heterostructure at the location for the drain contact.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 5A shows a schematic structure of an illustrative device according to an embodiment, while

FIG. 7A shows an illustrative chart of a donor doping level as a function of location in the gate-drain region for a channel layer and/or a barrier layer according to an embodiment, while

FIG. 9A shows an illustrative device having an insulating layer of varying thickness according to an embodiment, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a semiconductor device including a device channel with a gate-drain region having a carrier concentration that varies laterally along a direction from the gate contact to the drain contact. Lateral variation of the carrier concentration can be implemented by laterally varying one or more attributes of one or more layers located in the gate-drain region of the device. The lateral variation can be configured to increase uniformity of an electric filed distribution in a gate-drain region of the semiconductor device. The increased uniformity can result in a higher breakdown voltage for the device as compared to comparable devices with uniform carrier concentration in the device channel.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/−ten percent of the stated value, while the term "substantially" is inclusive of values within +/−five percent of the stated value. Unless otherwise stated, two values are "similar" when the smaller value is within +/−twenty-five percent of the larger value. A value, y, is on the order of a stated value, x, when the value y satisfies the formula $0.1x \leq y \leq 10x$.

As also used herein, a normally-on channel means a field-effect transistor channel that is in a conducting state when no external voltage or electric field is applied to it, while a normally-off channel means a field-effect transistor channel that is in the non-conducting state when no external voltage or electric field is applied to it. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent).

Figure 1:
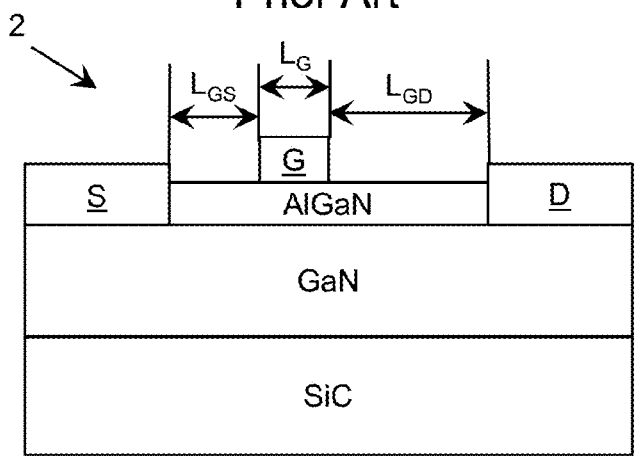
FIG. 1 shows a conventional heterostructure field effect transistor according to the prior art.
Figure 2:
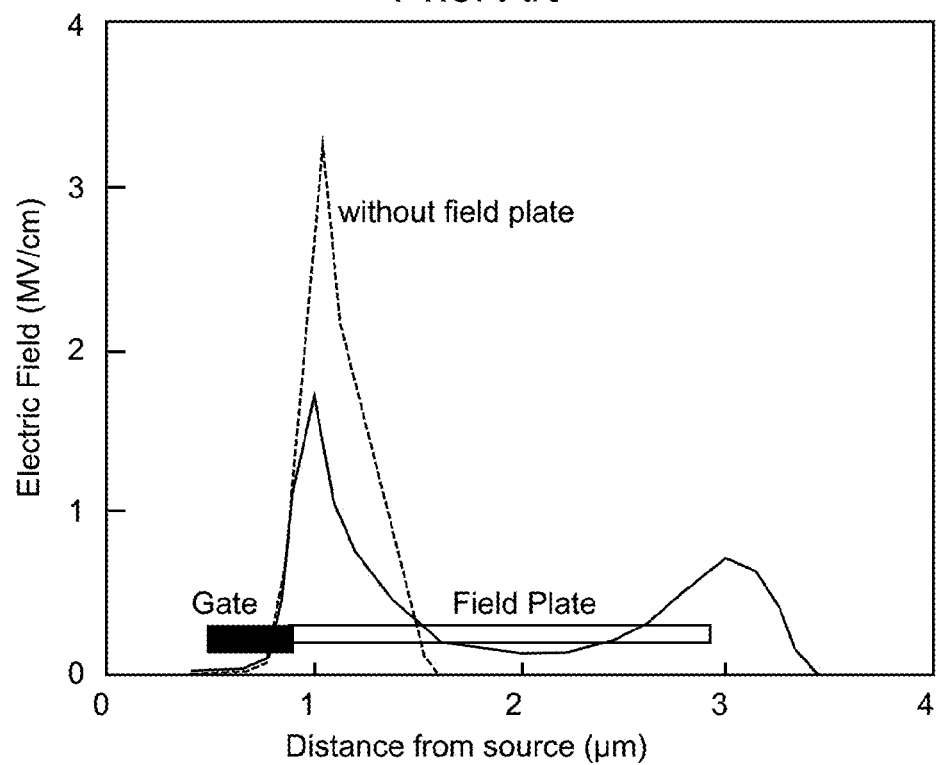
FIG. 2 shows an illustrative electric field distribution chart according to the prior art.
Figure 3:
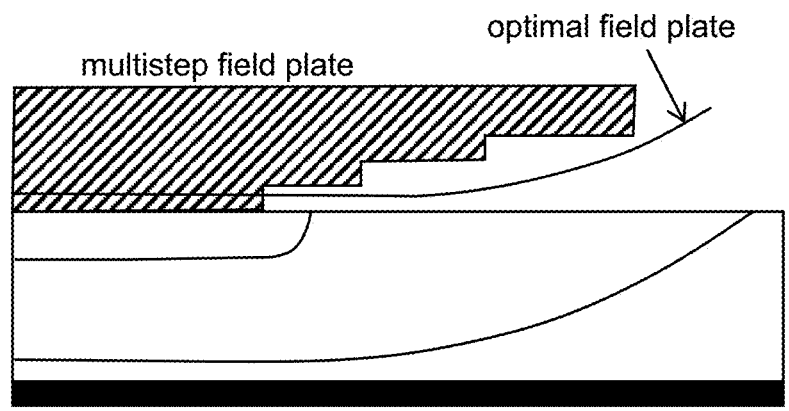
FIG. 3 shows a schematic structure of a multistep field plate according to the prior art.
Figure 4:
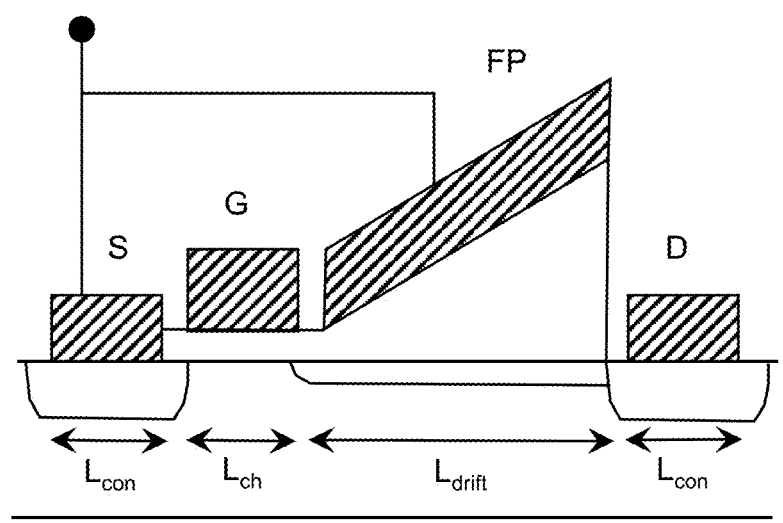
FIG. 4 shows a schematic structure of a gradual field plate according to the prior art.
Figure 5A:
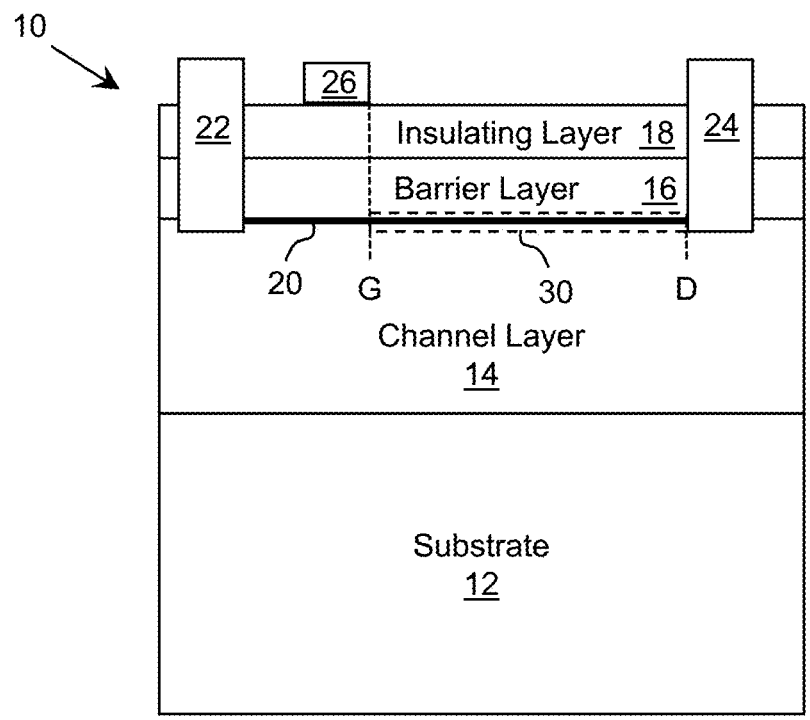

Turning to the drawings, FIG. 5A shows a schematic structure of an illustrative device 10, which can be operated as a field-effect transistor, according to an embodiment. The device 10 is shown including a substrate 12, a channel (buffer) layer 14, a barrier layer 16, and an insulating layer 18. A channel 20 is formed at a junction of the channel layer 14 and the barrier layer 16. In an embodiment, the substrate 12 is formed of silicon carbide (SiC), the channel layer 14 is formed of gallium nitride (GaN), the barrier layer 16 is formed of aluminum gallium nitride (AlGaN), and the insulating layer 18 is formed of silicon nitride ($Si_3N_4$). The device 10 is further shown including a source contact 22, a drain contact 24, and a gate contact 26. Each of the contacts 22, 24, 26 are located on a first side of the device 10 (e.g., above the channel layer 14), can be formed of metal, and can form any type of interface to the channel (e.g., Schottky, junction, heterojunction, metal insulator semiconductor, and/or the like). In an embodiment, one or more of the contacts 22, 24, 26 is an electrode.

However, it is understood that the device 10 is only illustrative of various possible devices. To this extent, a semiconductor layer described herein can be formed of any suitable type of semiconductor material. Illustrative semiconductor materials include: silicon (Si), silicon carbide (SiC), germanium (Ge), zinc oxide (ZnO), various types of group III-V or II-VI compound materials, and/or the like. Additionally, a device described herein can be fabricated on a substrate 12 formed of any of various types of compound semiconductor or dielectric materials, including for example: sapphire; diamond; mica; ceramic; Ge; various types of group III nitride substrates including GaN, AlN, BN, AlGaN, AlGaInN, GaBN, AlBN, AlInBN, AlGaBN, and/or the like; $LiGaO_2$; $LiNbO_2$; ZnO; Si; SiC; GaAs; and/or the like. Furthermore, the substrate 12 can comprise a conducting and/or semiconducting substrate. In an illustrative embodiment, the substrate 12 is formed of AlN, which can provide efficient heat removal from the active region due to a high thermal conductivity of AlN. In another embodiment, the channel layer 14 and/or the barrier layer 16 can be formed of AlInGaN, which can provide a high carrier concentration in the channel (e.g., up to $4 \times 10^{13}$ cm$^{-2}$).

Similarly, the semiconductor layers 14, 16 can be formed of any combination of various types of group III-V or II-VI compound materials. Illustrative group III-V materials include group III nitride materials, which include one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, GaBN, InGaN, AlGaBN, AlGaInN, AlInBN, and AlGaInBN with any molar fraction of group III elements. Additional illustrative group III-V materials include GaAs, GaAlAs, InGaAs, indium phosphorus (InP), and/or the like. The insulating layer 18 can be formed of any type of insulating material, such as any of various types of dielectric materials including, but not limited to, $SiO_2$, $Si_3N_4$, $Al_2O_3$, HfO, and/or the like. In an embodiment, the insulating layer 18 comprises a layer of dielectric material used as a cladding layer.

While not shown for clarity, it is understood that the device 10 can include various additional layers (e.g., an initiation layer and/or a buffer layer located between the substrate 12 and the channel layer 14). Additionally, one or more of the layers in a heterostructure described herein can include one or more attributes to alleviate strain. For example, a layer can be formed of a superlattice structure. Similarly, an embodiment of the device 10 can be implemented without an insulating layer 18 and/or with the gate 24 directly contacting the barrier layer 16, rather than being located on the insulating layer 18. Regardless, the device 10, and components thereof, can be manufactured and fabricated using any solution.

Embodiments of the device 10 adjust one or more attributes of the channel 20 in a gate-drain region 30 of the channel 20, thereby creating a laterally non-uniform channel 20. In an embodiment, the gate-drain region 30 of the channel 20 can have a carrier concentration that varies laterally. The carrier concentration variation exceeds any variation that may be present due to the limits of a manufacturing process. For example, the carrier concentration in the gate-drain region 30 of the channel 20 can vary by at least a multiple of two.

The attribute(s) of the channel 20 can be adjusted, for example, to result in a higher operating voltage and/or a lower on resistance for the device 10 as compared to a comparable device (e.g., similar size, materials, layers, and/or the like) having a uniform channel 20. For example, the lateral non-uniformity in the gate-drain region 30 of the channel 20 can be configured to achieve improved electric field uniformity in the gate-drain spacing. Furthermore, the electric field uniformity can be achieved without depositing additional electrodes, which can result in excessive capacitances.

As used herein, the gate-drain region 30 of the channel 20 corresponds to that portion of the channel 20 that is located between a location vertically aligned with an edge of the gate contact 26 closest to the drain 24 and a location vertically aligned with an edge of the drain contact 24 closest to the gate contact 26. Similarly, a gate-drain region of a semiconductor layer corresponds to that region of the layer that is vertically aligned with the gate-drain region 30 of the channel 20. As used herein, vertical refers to a growth direction of the semiconductor layers of the device 10.

Figure 5B:
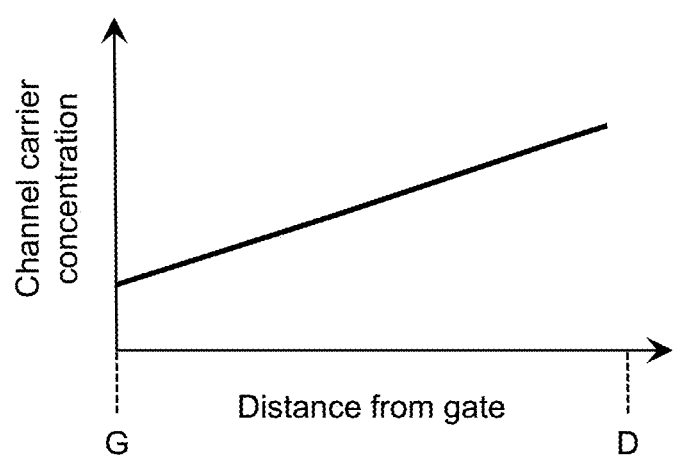
FIG. 5B shows a carrier concentration in the gate-drain region of the device of FIG. 5A according to an embodiment.

As illustrated in FIG. 5B, the gate-drain region 30 of the channel 20 can have a carrier concentration that increases linearly from a carrier concentration on a gate side G of the gate-drain region 30 to a carrier concentration on a drain side D of the gate-drain region 30. In an embodiment, the carrier concentration on the drain side D of the gate-drain region 30 is two to ten times the carrier concentration on the gate side G of the gate-drain region 30, which can provide effective control over the electric field profile of the device 10.

Figure 6:
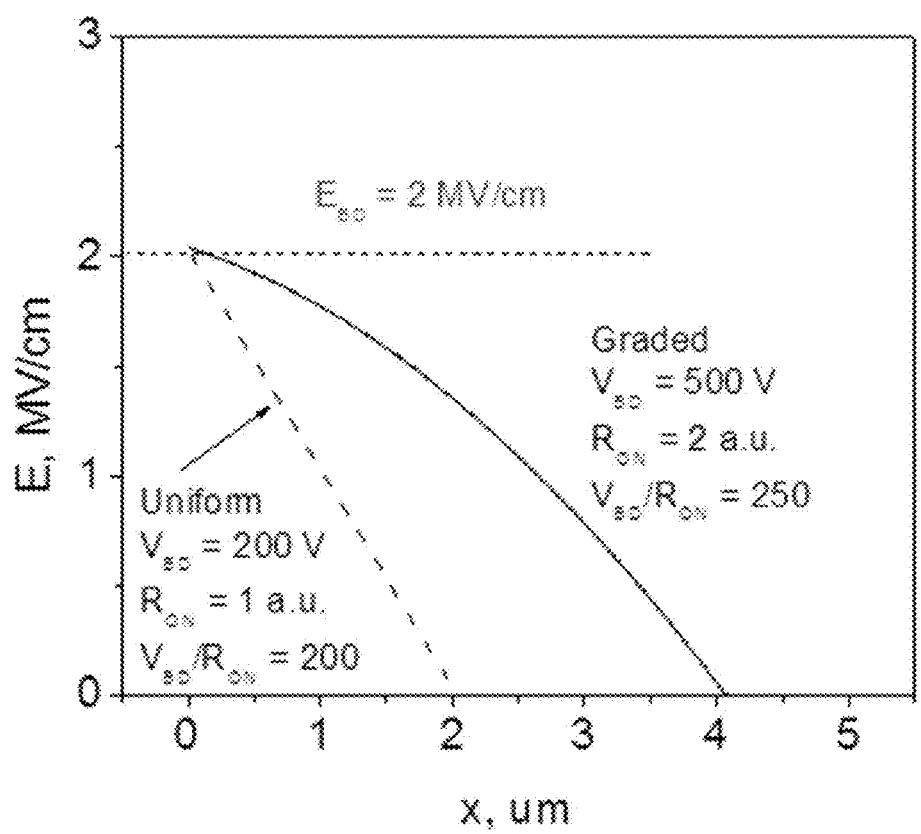
FIG. 6 shows a simulated electric field distribution in the gate-drain region of a prior art device and a device having a graded carrier concentration according to an embodiment.

FIG. 6 shows a simulated electric field distribution in the gate-drain region of a prior art device having a uniform carrier concentration in the gate-drain region 30 and the device 10 shown in FIG. 5A having the graded carrier concentration shown in FIG. 5B according to an embodiment. In this example, the carrier concentration changes from $1\times10^{19}$ cm$^{-3}$ at the gate edge to $2\times10^{19}$ cm$^{-3}$ at the drain edge, the gate-drain spacing is 5 µm, and the critical electric field, E, is 2 MV/cm. As illustrated, for the uniform carrier concentration device, the electric field (dashed line) in the gate-drain spacing has a triangular shape. Numerical simulations indicate that when the peak electric field near the gate edge reaches the critical value, the total voltage in the gate-drain spacing (the breakdown voltage $V_{BD}$) is 200 V. The on state resistance ($R_{ON}$) for the uniform carrier concentration device is assumed to be 1 arbitrary unit (a.u.).

For the same peak electric field value at the gate edge, the simulated device 10 having a graded carrier concentration had a breakdown voltage, $V_{BD}$, of 500 Volts and an on resistance, $R_{ON}$, of 2 arbitrary units. As a result, a device figure of merit ($V_{BD}/R_{ON}$) increases from 200 to 250, or about 25%, for the device 10 as compared to a device having a uniform carrier concentration.

A desired non-uniform carrier concentration, such as the graded carrier concentration shown in FIG. 5B, can be achieved by profiling any combination of one or more of the device parameters that affect the carrier concentration in the channel 20. Illustrative device parameters include: a doping level; a composition; a thickness of the barrier layer 16; a thickness of the dielectric layer 18; a strain between the barrier layer 16 and the channel layer 14, and/or the like.

Figure 7A:
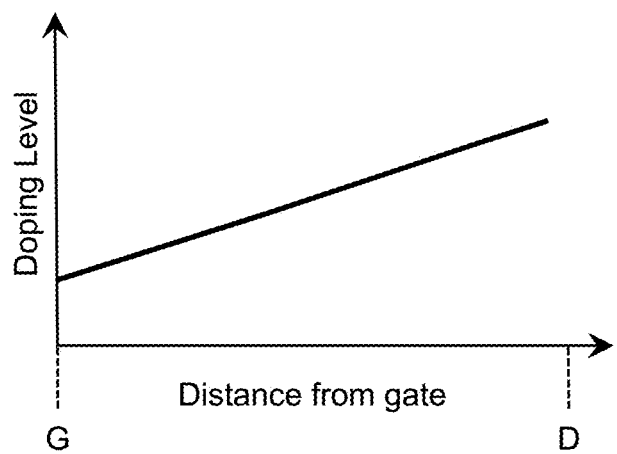

In an illustrative embodiment, the set of device parameters includes lateral variation of a doping level of the channel layer 14 and/or a doping level of the barrier layer 16 in a region corresponding to the gate-drain region 30 of the channel 20. FIG. 7A shows an illustrative chart of a donor doping level as a function of location in the gate-drain region for a channel layer 14 and/or a barrier layer 16 according to an embodiment. In particular, the laterally variable donor doping levels shown in FIG. 7A can be used to create the non-uniform carrier concentration shown in FIG. 5B. To this extent, a doping level of the corresponding donor can be increased in a linear fashion as a distance from the gate contact 26 increases.

Lateral variation of the doping level(s) of the channel layer 14 and/or the barrier layer 16 in the gate-drain region can be implemented using any solution. For example, such lateral variation can be achieved using a laterally non-uniform or multi-step ion implantation or diffusion. The relative variation in the doping level can be approximately the same as the desired variation in the carrier concentration as described above. For example, an illustrative range of the doping levels is $5\times10^{18}$-$5\times10^{19}$ cm$^{-3}$.

Figure 7B:
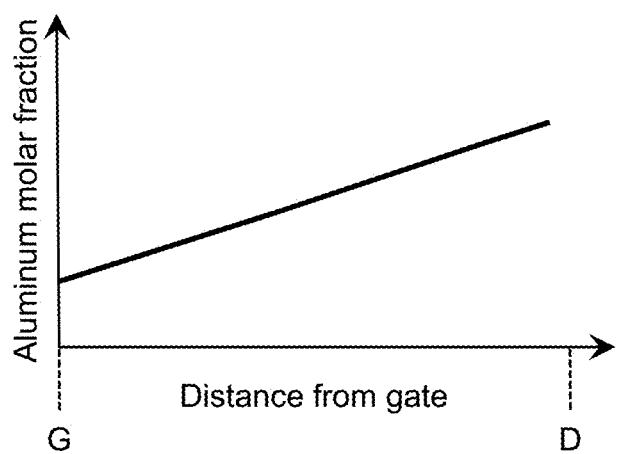
FIG. 7B shows an illustrative chart of an aluminum molar fraction in a barrier layer as a function of location in the gate-drain region according to an embodiment.

In another illustrative embodiment, the set of device parameters includes a laterally varying composition of the barrier layer 16 and/or the channel layer 14 in the gate-drain region. For example, FIG. 7B shows an illustrative chart of an aluminum molar fraction in a barrier layer 16 as a function of location in the gate-drain region according to an embodiment. In this case, the barrier layer 16 can comprise an AlGaN layer. In particular, the laterally variable aluminum molar fractions shown in FIG. 7B can be used to create the non-uniform carrier concentration in the gate-drain region 30 of the channel 20 shown in FIG. 5B. To this extent, an aluminum molar fraction can be increased in a linear fashion as a distance from the gate contact 26 increases.

Lateral variation of the composition of the barrier layer 16 in the gate-drain region can be implemented using any solution. For example, such lateral variation can be achieved using a laterally non-uniform or multi-step ion implantation. In an illustrative embodiment of an AlGaN barrier layer 16, the Al composition in the barrier layer 16 can change from 20% at the gate edge to around 40% at the drain edge.

In still another illustrative embodiment, the set of device parameters includes lateral variation of a strain between the channel layer 14 and the barrier layer 16. Lateral variation of the strain between the channel layer 14 and the barrier layer 16 in the gate-drain region can be implemented using any solution, such as by varying a thickness of the barrier layer 16, varying composition of the barrier layer 16 and/or the channel layer 14, by combination of two or more of these approaches, and/or the like. A change in the strain mainly affects the channel carrier concentration due to piezoelectric effect strongly pronounced in the materials, e.g., of group III-nitride materials.

Figure 8A:
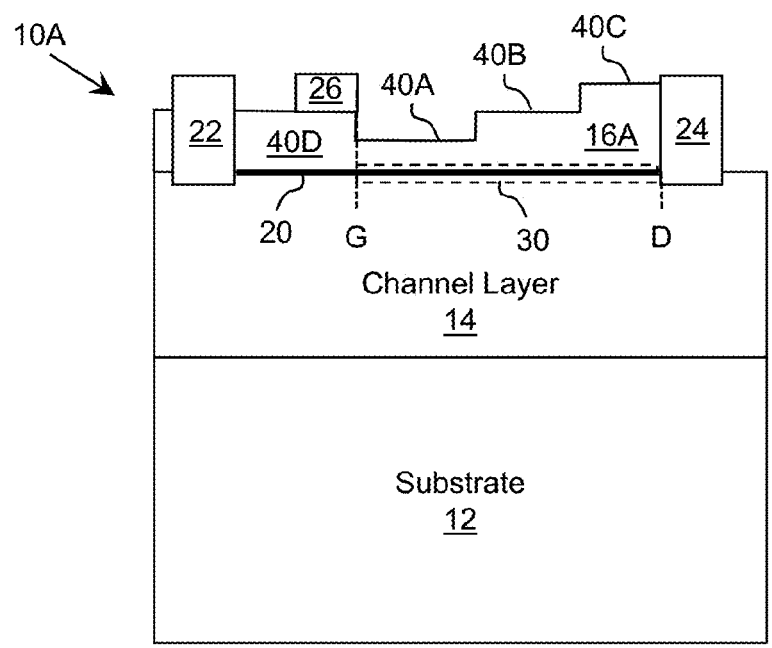
FIGS. 8A and 8B show illustrative devices having barrier layers of varying thicknesses according to embodiments.
Figure 8B:
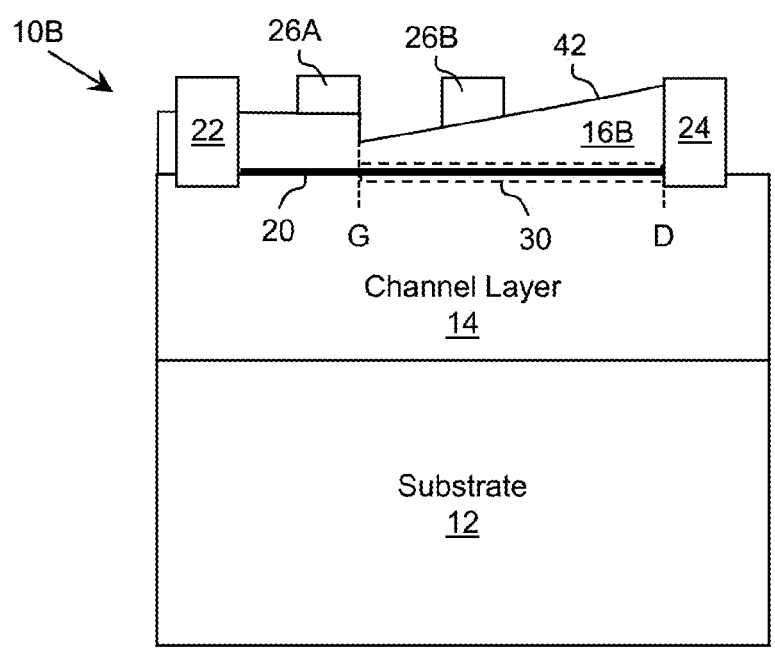

In yet another illustrative embodiment, the set of device parameters includes lateral variation of a thickness of the barrier layer 16 in the gate-drain region 30. To this extent, FIGS. 8A and 8B show illustrative devices 10A, 10B, respectively, having barrier layers 16A, 16B, respectively, of varying thicknesses according to embodiments. In FIG. 8A, the barrier layer 16A is shown having a multi-step profile, which includes three lateral sections 40A, 40B, 40C located between the gate 26 and the drain 24, each having a corresponding unique section thickness. As illustrated, each lateral section 40A, 40B, 40C of the barrier layer 16A can have approximately the same lateral size. Additionally, the change in section thickness between each of the immediately adjacent lateral sections 40A, 40B, 40C of the barrier layer 16A can be approximately the same distance. However, it is understood that these features, along with the number of lateral sections 40A, 40B, 40C located within the gate-drain region are only illustrative, and various alternative configurations can be implemented.

Furthermore, the section 40D of the barrier layer 16A located outside of the gate-drain region is shown having a uniform thickness. The thickness of the first lateral section 40B can be smaller than the thickness of the section 40D. Regardless, the thicknesses of each of the sections 40A-40D of the barrier layer 16A can be configured based on a target set of operating parameters for the corresponding device 10A. In general, carrier concentration can increase linearly with the barrier thickness when the barrier thickness is relatively small, e.g., below 30 nm for group III-nitride and AIIIBV barrier materials. The barrier thickness can be selected to provide the desired carrier concentration in the device channel as described herein.

As an illustrative example, for a device containing an AlGaN barrier layer 16 over a GaN channel layer 14, the thicknesses of lateral sections 40A, 40B, 40C can be 10 nm, 20 nm, and 30 nm, respectively. In this case, these variations would result in increasing sheet carrier concentrations in the device channel ranging typically from $5 \times 10^{12}$ cm$^{-2}$ to $1.5 \times 10^{13}$ cm$^{-2}$. While increasing the barrier layer thickness from the gate edge towards the drain edge can provide a more uniform electric field, it is understood that embodiments of the invention are not limited to this type of profile only. To this extent, in other embodiments, the thickness of the barrier layer could decrease in the direction from the gate edge to the drain edge over all or a portion of the barrier layer in the gate-drain region. Different thicknesses of the barrier layer lateral sections 40A-40C in the gate-drain region can be achieved by, for example, selective etching or selective epitaxial growth.

In FIG. 8B, the barrier layer 16B has a continuously changing barrier thickness 42 within the gate-drain region. The barrier thickness 42 can result in a carrier concentration that also is continuously changing within the gate-drain region 30 of the channel 20. In particular, the linearly changing barrier thickness 42 can cause the carrier concentration to also change linearly. The linearly changing barrier thickness 42 can be obtained, for example, by reactive ion etching through a non-uniform mask.

Figure 9A:
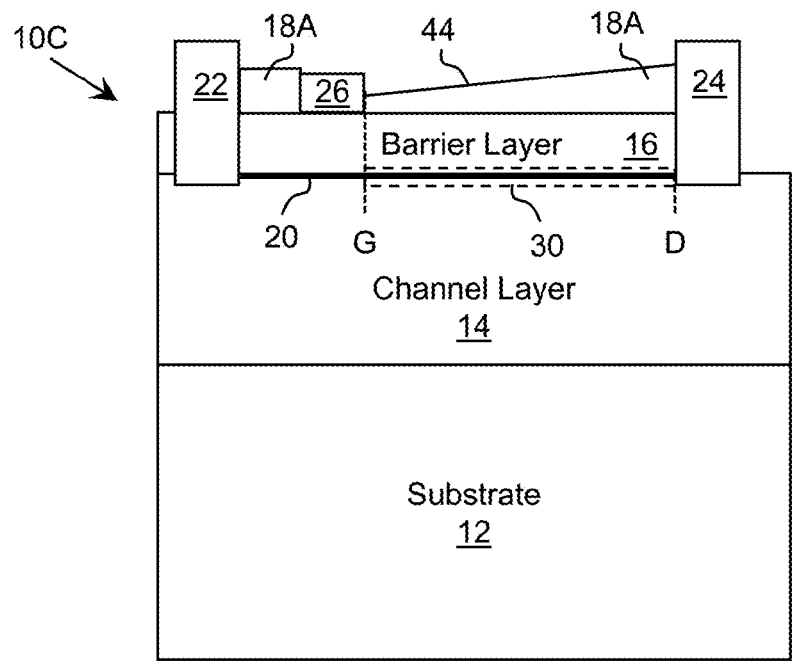

In still another illustrative embodiment, the set of device parameters includes lateral variation of a thickness of the insulating layer 18 in the gate-drain region 30. To this extent, FIG. 9A shows an illustrative device 10C having an insulating layer 18A of varying thickness according to an embodiment. In particular, the insulating layer 18A has a continuously changing dielectric thickness 44 within the gate-drain region, while the insulating layer 18A located outside of the gate-drain region (e.g., between the gate 26 contact and the source contact 22) can have a substantially uniform thickness. The dielectric thickness 44 can result in a carrier concentration that also is continuously changing within the gate-drain region 30 of the channel 20. In particular, a linearly changing dielectric thickness 44 can result in changing work function difference and interface state charges between the insulating layer 18A and the barrier layer 16, which affects the carrier concentration in the gate-drain region 30 of the channel 20. The particular dependence of the carrier concentration on the dielectric thickness 44 depends strongly on a quality of the dielectric material and a quality of the dielectric/semiconductor interface. Regardless, for a high quality dielectric material and interface, the channel concentration dependence on the dielectric thickness 44 would be similar to that of the barrier thickness. A linearly changing dielectric thickness can be obtained, for example, by etching through a non-uniform mask, dielectric deposition using a tilted substrate, and/or the like.

Figure 9B:
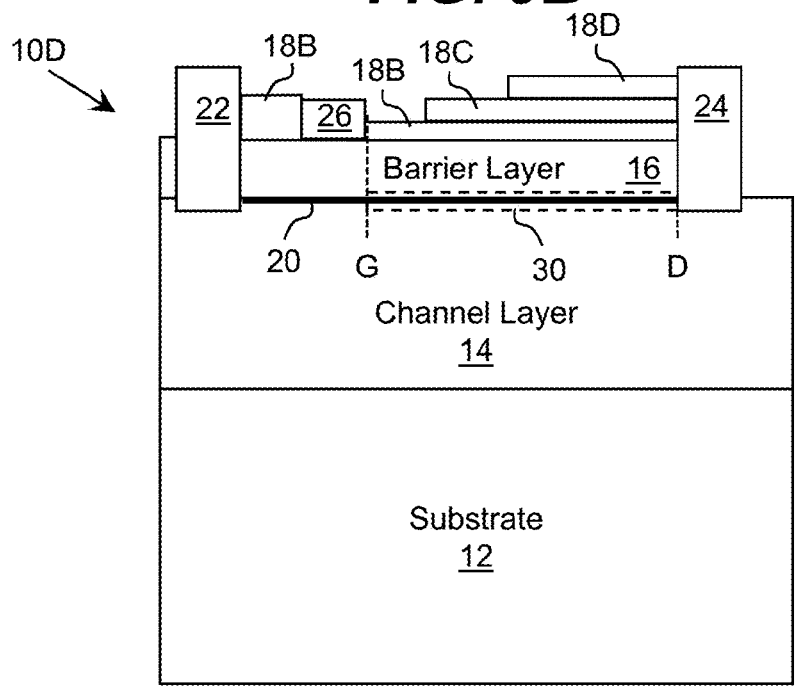
FIG. 9B shows an illustrative device having multiple insulating layers with a multi-step profile according to an embodiment.

FIG. 9B shows an illustrative device 10D having multiple insulating layers 18B-18D present in the gate-drain region with a multi-step profile according to an embodiment. As illustrated, each layer 18B-18D can extend from an edge of the drain contact 24 into the gate-drain region successively smaller distances. For example, the first insulating layer 18B can cover the entire gate-drain region, thereby contacting both the gate contact 26 and the drain contact 24. Each subsequent insulating layer 18C-18D can extend only a portion of the distance from the drain contact 24 to the gate contact 26. Outside of the gate-drain region (e.g., between the gate 26 contact and the source contact 22), a single insulating layer, such as an insulating layer 18B made from the same material as the bottom insulating layer 18B within the gate-drain region, can be included. While three insulating layers 18B-18D are shown, it is understood that any number of insulating layers 18B-18D can be included. Furthermore, while the insulating layers 18B-18D are shown having similar thicknesses and forming steps of similar lateral sizes, it is understood that this is only illustrative and layers 18B-18D of significantly different thicknesses and steps of significantly different sizes can be implemented in embodiments.

As an illustrative example, the insulating layers 18B-18D can be formed of $SiO_2$, $SI_3N_4$, and $Al_2O_3$, respectively. This configuration corresponds to a gradually increasing dielectric permittivity of the insulating layers 18B-18D. A higher dielectric permittivity results on a higher carrier concentration in the channel, with the dependence being approximately linear. The insulating layers 18B-18D can be obtained by, for example, sequential sputtering, MOCVD deposition, or other techniques. A thickness for each of the insulating layers 18B-18D can be in the range of 5 nm to 50 nm for group III-nitride or AIIIBV material systems. Any number of steps can be implemented depending on the resolution of the photolithography technique used in device fabrication. In an embodiment, a minimal lateral size of each insulating layer 18B-18D can be in a range of 0.1-0.2 μm.

It is understood that features shown and described only in conjunction with one of the devices shown herein, can be included in combination with features shown in other devices. To this extent, the various features shown in each of the drawings are not mutually exclusive. As a result, an embodiment can include a device having a channel 20 with a carrier concentration that varies laterally in the gate-drain region 30 as a result of any combination of one or more of the designs described herein. Furthermore, although shown included in each device, it is understood that embodiments of the devices described herein can be implemented without a substrate.

Additionally, it is understood that each device shown and described herein can include one or more additional features, which can be configured to adjust the carrier concentration in the channel 20 and/or improve one or more other aspects of the device. For example, embodiments of a device described herein can include one or more of the channel layer, barrier layer, or insulating layer, which is formed of a short-period superlattice (SPSL) structure. Use of a SPSL structure can allows for more efficient control of strain and polarization charges. Additionally, a SPSL structure can help achieve a desired doping level in the corresponding layer. An illustrative example of a SPSL for a device made using group III-nitride materials includes: AlGaN/AlGaN for the barrier layer; InGaN/GaN or AlInGaN/GaN for the channel layer. The aluminum composition in the SPSL for the barrier layer and SPSL for the channel layer can be in the 20%-40% range, while the indium composition in the channel layer SPSL would typically be in the 5%-10% range.

Additionally, as illustrated in FIG. 8B, a device described herein, such as the device 10B, can include a gate structure which includes multiple gate contacts (electrodes) 26A, 26B. In this case, the gate-drain region 30 of the channel 20 can correspond to the region defined by the gate contact 26A located furthest from the drain contact 24. Multiple gate contacts can induce laterally variable electron concentration in the channel, thus acting similarly to the other approaches described herein. The electron concentration in the channel varies linearly with the applied gate voltage. For a typical AlGaN/GaN device, voltages in the range of −5 V to +2 V applied to multiple gate electrodes, would cause a change in the channel concentration from nearly zero to around $2 \times 10^{13}$ $cm^{-2}$. Additionally, one or more of the contacts 22, 24, 26 can include a field plate (such as a field plate shown in the prior art figures) directly or capacitively coupled thereto. For example, the gate contact 26 can include a field plate, which extends beyond the gate contact 26 towards the drain contact 24 over a portion of the gate-drain region. Similarly, the drain contact 26 can include a field plate, which extends beyond the drain contact 24 towards the gate contact 26 over a portion of the gate-drain region.

Figure 10:
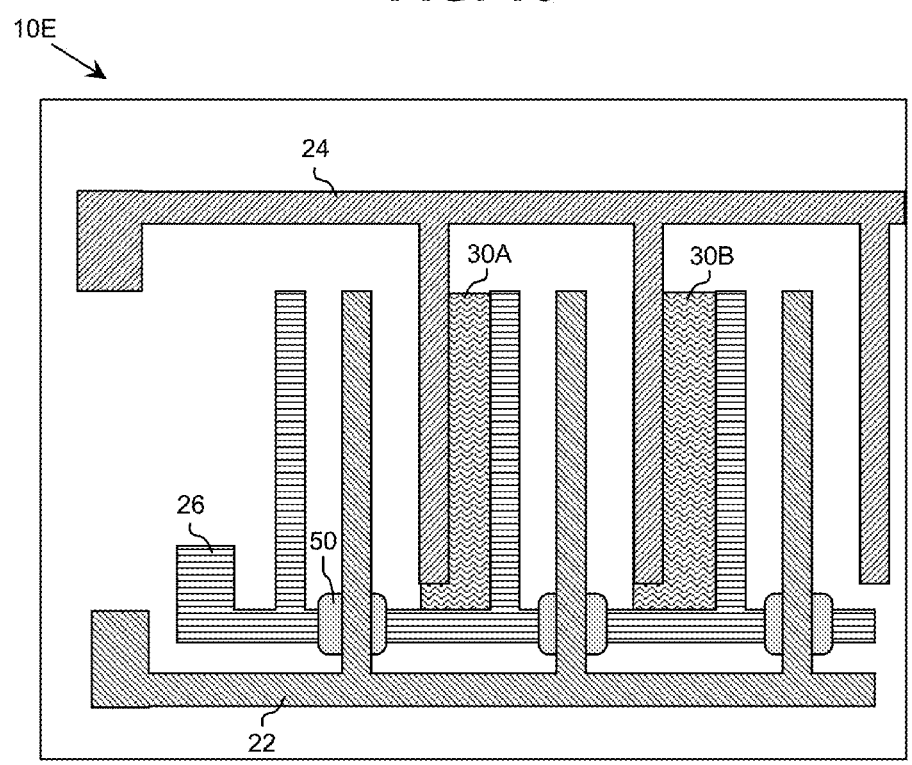
FIG. 10 shows a top view of an illustrative semiconductor device according to an embodiment.

In an embodiment, a device includes source and drain electrodes that form a multi-finger pattern. To this extent, FIG. 10 shows a top view of an illustrative semiconductor device 10E according to an embodiment. As illustrated, the source contact 22, drain contact 24, and the gate contact 26 form a multi-finger pattern. The device 10E can further include an insulator 50 located between the source contact 22 and the gate contact 26. In this configuration, the device 10E includes multiple gate-drain regions 30A, 30B. One or more of the gate-drain regions 30A, 30B can be configured to have a laterally varying carrier concentration in the corresponding channel. The lateral variation in the gate-drain regions 30A, 30B can be implemented using any combination of one or more of the designs described herein. Furthermore, each gate-drain region 30A, 30B can use the same or different solution than another gate-drain region 30A, 30B.

While illustrative aspects of the invention have been shown and described herein primarily in conjunction with a heterostructure for a field effect transistor and a method of fabricating such a heterostructure and/or device, it is understood that aspects of the invention further provide various alternative embodiments.

Figure 11:
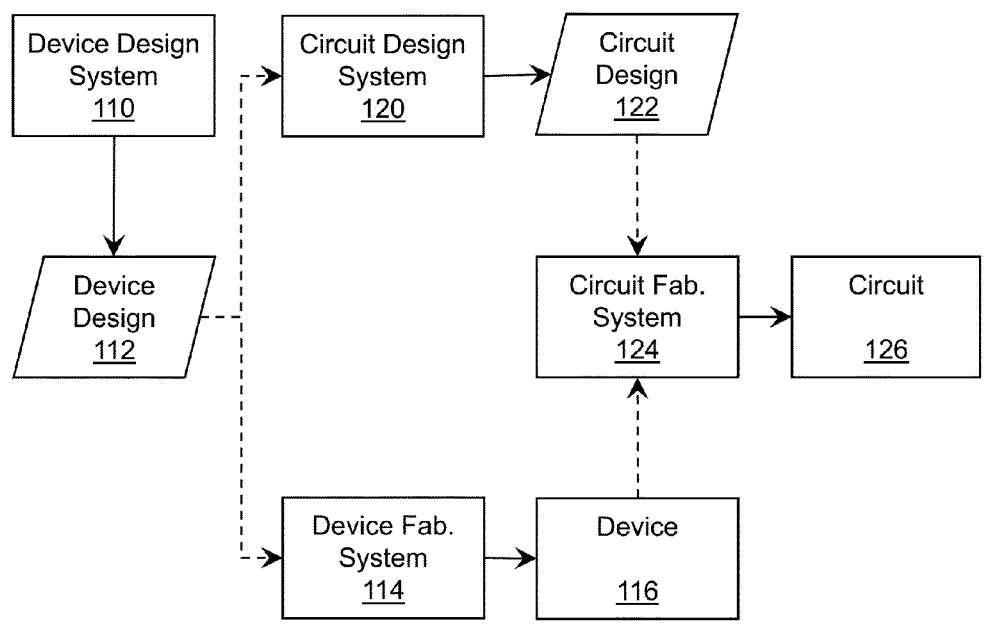
FIG. 11 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor device comprising:
a semiconductor heterostructure forming a device channel, wherein the semiconductor heterostructure includes:
a channel layer; and
a barrier layer located immediately adjacent to the channel layer, wherein the device channel is formed at an interface between the channel layer and the barrier layer, and wherein the channel layer and the barrier layer are each formed of a group III nitride material;
a gate contact located on the semiconductor heterostructure; and
a drain contact located on the semiconductor heterostructure,
wherein the gate contact is located on the barrier layer and the drain contact extends through the barrier layer,
wherein the device channel includes a gate-drain region located between the gate contact and the drain contact, and
wherein the gate-drain region of the device channel has a carrier concentration that varies laterally along a direction from the gate contact to the drain contact.

2. The device of claim 1, wherein the channel layer is formed of gallium nitride and the barrier layer is formed of aluminum gallium nitride.

3. The device of claim 2, wherein a molar fraction of aluminum in the barrier layer varies laterally along the direction from the gate contact to the drain contact.

4. The device of claim 1, wherein a doping level in at least one of: the barrier layer or the channel layer, varies laterally along the direction from the gate contact to the drain contact.

5. The device of claim 1, wherein an amount of strain at the interface of the barrier layer and the channel layer varies laterally along the direction from the gate contact to the drain contact.

6. The device of claim 1, wherein a barrier thickness of the barrier layer varies laterally along the direction from the gate contact to the drain contact.

7. The device of claim 6, wherein the barrier layer includes a plurality of steps, each step corresponding to a change in the barrier thickness of the barrier layer.

8. The device of claim 1, wherein the semiconductor heterostructure further includes a set of dielectric layers located immediately adjacent to the barrier layer.

9. The device of claim 8, wherein a dielectric thickness of the set of dielectric layers varies laterally along the direction from the gate contact to the drain contact.

10. The device of claim 8, wherein the set of dielectric layers includes a plurality of dielectric layers located between the gate contact and the drain contact, and wherein the plurality of dielectric layers form a plurality of steps, each step corresponding to a change in the dielectric thickness of the set of dielectric layers.

11. A method of fabricating a semiconductor device, the method comprising:
fabricating a semiconductor heterostructure forming a device channel, wherein the fabricating the semiconductor heterostructure includes:
fabricating a channel layer; and
fabricating a barrier layer located immediately adjacent to the channel layer, wherein the device channel is formed at an interface between the channel layer and the barrier layer, and wherein the channel layer and the barrier layer are each formed of a group III nitride material;
fabricating a gate contact on the semiconductor heterostructure; and
fabricating a drain contact on the semiconductor heterostructure,
wherein the gate contact is located on the barrier layer and the drain contact extends through the barrier layer,
wherein the device channel includes a gate-drain region located between the gate contact and the drain contact,
wherein the gate-drain region of the device channel has a carrier concentration that varies laterally along a direction from the gate contact to the drain contact, and
wherein the laterally varying carrier concentration increases uniformity of an electric field distribution in a gate-drain region of the semiconductor device.

12. The method of claim 11, wherein the fabricating the barrier layer includes laterally varying a molar fraction of aluminum in the barrier layer along the direction from the gate contact to the drain contact.

13. The method of claim 11, wherein the fabricating the semiconductor heterostructure includes laterally varying a doping level in at least one of: the barrier layer or the channel layer, along the direction from the gate contact to the drain contact.

14. The method of claim 11, wherein the fabricating the barrier layer includes laterally varying a barrier thickness of the barrier layer along the direction from the gate contact to the drain contact.

15. The method of claim 11, wherein the fabricating the semiconductor heterostructure further includes fabricating a set of dielectric layers located immediately adjacent to the barrier layer, wherein the fabricating the set of dielectric layers includes laterally varying a dielectric thickness of the set of dielectric layers along the direction from the gate contact to the drain contact.

16. A semiconductor device comprising:
a semiconductor heterostructure forming a device channel, wherein the semiconductor heterostructure includes:
a channel layer;
a barrier layer located immediately adjacent to the channel layer, wherein the device channel is formed at an interface between the channel layer and the barrier layer; and
a set of dielectric layers located immediately adjacent to the barrier layer;

a gate contact located on the semiconductor heterostructure; and a drain contact located on the semiconductor heterostructure, wherein the gate contact is located on the barrier layer and the drain contact extends through the barrier layer, wherein the device channel includes a gate-drain region located between the gate contact and the drain contact, and wherein the gate-drain region of the device channel has a carrier concentration that varies laterally along a direction from the gate contact to the drain contact.

17. The semiconductor device of claim 16, wherein a dielectric thickness of the set of dielectric layers varies laterally along the direction from the gate contact to the drain contact.

18. The device of claim 16, wherein the set of dielectric layers includes a plurality of dielectric layers located between the gate contact and the drain contact, and wherein the plurality of dielectric layers form a plurality of steps, each step corresponding to a change in the dielectric thickness of the set of dielectric layers.

19. The device of claim 16, wherein an amount of strain at the interface of the barrier layer and the channel layer varies laterally along the direction from the gate contact to the drain contact.

20. The device of claim 16, wherein a barrier thickness of the barrier layer varies laterally along the direction from the gate contact to the drain contact.

* * * * *